United States Patent
Song et al.

(10) Patent No.: US 10,432,183 B2
(45) Date of Patent: Oct. 1, 2019

(54) CLOCK GENERATION CIRCUIT HAVING DESKEW FUNCTION AND SEMICONDUCTOR INTEGRATED CIRCUIT DEVICE INCLUDING SAME

(71) Applicant: SAMSUNG ELECTRONICS CO., LTD., Suwon-si, Gyeonggi-do (KR)

(72) Inventors: Jin Ook Song, Seoul (KR); Bong Il Park, Seongnam-si (KR); Jae Gon Lee, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/388,602

(22) Filed: Apr. 18, 2019

(65) Prior Publication Data
US 2019/0245529 A1 Aug. 8, 2019

Related U.S. Application Data

(62) Division of application No. 15/290,344, filed on Oct. 11, 2016.

(30) Foreign Application Priority Data

Oct. 21, 2015 (KR) .................. 10-2015-0146933

(51) Int. Cl.
*H03K 5/135* (2006.01)
*H03K 5/05* (2006.01)
*H03K 5/00* (2006.01)
*H03K 19/20* (2006.01)

(52) U.S. Cl.
CPC ............... *H03K 5/135* (2013.01); *H03K 5/05* (2013.01); *H03K 19/20* (2013.01); *H03K 2005/00078* (2013.01); *H03K 2005/00234* (2013.01)

(58) Field of Classification Search
CPC ...... H03K 5/00006; H03K 5/05; H03K 5/135; H03K 21/026; H03K 21/10; H03K 23/40; H03K 23/483; H03K 23/50–505; H03K 23/70
See application file for complete search history.

(56) References Cited

U.S. PATENT DOCUMENTS

| | | |
|---|---|---|
| 5,467,474 A | 11/1995 | Oprescu et al. |
| 5,642,060 A | 6/1997 | Kaneko |
| 5,731,715 A | 3/1998 | Mote, Jr. |
| 6,507,230 B1 | 1/2003 | Milton |
| 7,353,420 B2 | 4/2008 | Tsai |
| 7,424,087 B2 | 9/2008 | Koh |
| 7,443,222 B1 | 10/2008 | Saxe et al. |

(Continued)

*Primary Examiner* — Patrick O Neill
(74) *Attorney, Agent, or Firm* — Volentine, Whitt & Francos, PLLC (57) ABSTRACT

A clock generation circuit having a deskew function and a semiconductor integrated circuit device including the same are provided. The clock generation circuit includes a clock gating circuit configured to gate an input clock signal based on a first waveform signal to generate a first output signal, a flip-flop configured to receive the input clock signal and a second waveform signal and to generate a second output signal, and an OR circuit configured to perform an OR operation on the first output signal and the second output signal to generate an output clock signal having a period which is N times a period of the input clock signal.

10 Claims, 10 Drawing Sheets

(56) References Cited

U.S. PATENT DOCUMENTS

| | | | |
|---|---|---|---|
| 7,456,674 B2 | 11/2008 | Oakland | |
| 7,996,807 B2 | 8/2011 | Grise et al. | |
| 8,558,589 B2 * | 10/2013 | Dahan | G06F 1/04 |
| | | | 327/115 |
| 8,736,340 B2 | 5/2014 | Milton | |
| 2009/0115468 A1 | 5/2009 | Berthold et al. | |
| 2017/0117886 A1 * | 4/2017 | Song | H03K 5/135 |

* cited by examiner

CLOCK GENERATION CIRCUIT HAVING DESKEW FUNCTION AND SEMICONDUCTOR INTEGRATED CIRCUIT DEVICE INCLUDING SAME

CROSS-REFERENCE TO RELATED APPLICATIONS

This is a Divisional of U.S. application Ser. No. 15/290,344, filed Oct. 11, 2016, and a claim of priority under 35 U.S.C. § 119(a) is made to Korean Patent Application No. 10-2015-0146933 filed on Oct. 21, 2015, the disclosures of which are hereby incorporated by reference in their entireties.

BACKGROUND

Certain embodiments of the inventive concept relate to clock generation circuits having a deskew function. Other embodiments of the inventive concept relate to semiconductor integrated circuit (IC) devices, such as a system-on-chip (SoC), memory device, or processor including a clock generation circuit having a deskew function.

Semiconductor ICs such as a SoC, processor, or memory device often require one or more clock signal(s). A clock divider may be used to divide the frequency of an input clock signal in order to generate a clock signal having a required frequency.

Unfortunately, the frequency division of a clock signal may introduce skew. Skew may be understood as a difference between a desired clock signal arrival time (e.g., a clock transition, a rising clock edge, a falling clock edge, etc.) and an actual clock signal arrival time. And clock dividers are often characterized by large latency periods and poor jitter characteristics. Accordingly, a deskew circuit is often required to improve jitter characteristics by eliminating or reducing clock signal skew. It is therefore typical to provide a deskew circuit together with a clock divider. Unfortunately, the circuitry necessary to deskew both rising and falling edges of a clock signal currently requires a great many constituent elements (e.g., flip-flops) and is highly complex in its design and operation.

SUMMARY

According to some embodiments of the inventive concept, there is provided a clock generation circuit including; a clock gating circuit configured to receive a first waveform signal in response to an input clock signal and generate a first output signal, a flip-flop configured to receive the input clock signal and a second waveform signal and generate a second output signal, and an OR circuit configured to perform an OR operation on the first output signal and the second output signal to generate an output clock signal having a period which is N times that of a period of the input clock signal, where 'N' is a positive real number.

According to some embodiments of the inventive concept, there is provided a semiconductor integrated circuit device including; a clock generation circuit configured to receive an input clock signal and generate an output clock signal having a period N times that of a period of the input clock signal and having skew of at least one of a rising edge and a falling edge reduced, where N is a positive real number, and a logic circuit configured to receive the output clock signal, wherein the clock generation circuit includes; a clock gating circuit configured to receive a first waveform signal in response to the input clock signal and generate a first output signal, a first flip-flop configured to delay a second waveform signal in response to the input clock signal to generate a second output signal, and an OR circuit configured to perform an OR operation on the first output signal and the second output signal to generate the output clock signal.

According to some embodiments of the inventive concept, there is provided a clock generation circuit including; a waveform generator configured to generate a first waveform signal and a second waveform signal having a period that is N times a period of an input clock signal, where N is a positive real number, a clock gating circuit configured to gate the input clock signal based on the first waveform signal to generate a first output signal, a flip-flop configured to receive the input clock signal and the second waveform signal and to generate a second output signal, and an OR circuit configured to perform an OR operation on the first output signal and the second output signal to generate an output clock signal.

According to some embodiments of the inventive concept, there is provided a clock generation circuit including; a waveform generator configured to generate a first waveform signal and a second waveform signal from an input clock signal, a buffer configured to receive the input clock signal and generate a buffered input clock signal, a clock gating circuit configured to receive the first waveform signal, gate the first waveform signal in response to the buffered input clock signal, and generate a first output signal, a flip-flop configured to receive the buffered input clock signal and the second waveform signal and generate a second output signal, and an OR circuit configured to perform an OR operation on the first output signal and the second output signal to generate an output clock signal.

BRIEF DESCRIPTION OF THE DRAWINGS

The above and other features and advantages of the inventive concept will become more apparent by describing in detail exemplary embodiments thereof with reference to the attached drawings in which.

DETAILED DESCRIPTION

The inventive concept now will be described in some additional detail with reference to the accompanying drawings. The inventive concept may, however, be embodied in many different forms and should not be construed as being limited to only the illustrated embodiments. Rather, these embodiments are provided so that this disclosure will be thorough and complete, and will fully convey the scope of the inventive concept to those skilled in the art. Throughout the written description and drawings, like reference numbers and labels are used to denote like or similar elements.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 1:
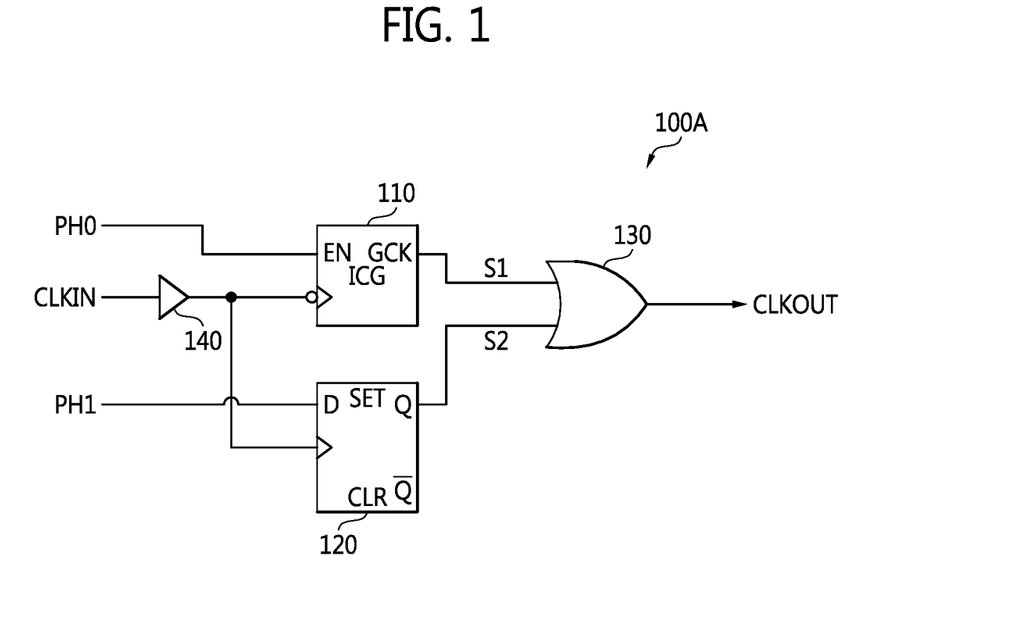
FIG. 1 is a circuit diagram of a clock generation circuit according to some embodiments of the inventive concept.
Figure 2:
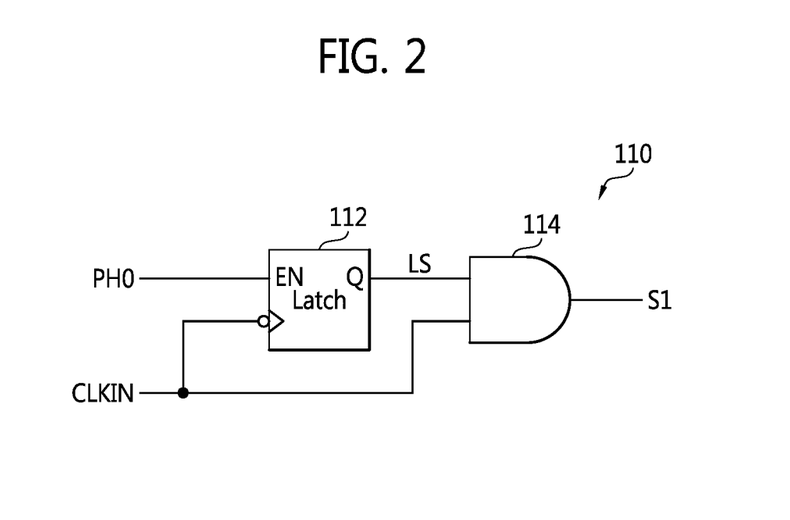
FIG. 2 is a circuit diagram of a clock gating circuit illustrated in FIG. 1 according to some embodiments of the inventive concept.

FIG. 1 is a circuit diagram illustrating a clock generation circuit 100A according to some embodiments of the inventive concept. FIG. 2 is a circuit diagram further illustrating in one example the clock gating circuit 110 of FIG. 1. Referring to FIGS. 1 and 2, the clock generation circuit 100A includes the clock gating circuit 110, a flip-flop 120, and an OR circuit 130.

The clock gating circuit 110 receives an input clock signal CLKIN and a first waveform signal PH0 and generates a first output signal S1. Here, the clock gating circuit 110 may output, as the first output signal S1, the input clock signal CLKIN during only a particular period based on the first waveform signal PH0, so that the input clock signal CLKIN is "gated by the first waveform signal PH0" in order to generate the first output signal S1.

For instance, the clock gating circuit 110 may latch the first waveform signal PH0 and perform an AND operation on the first waveform signal PH0 and the input clock signal CLKIN during a "low period" in which the input clock signal CLKIN has a first logic level (e.g., a "low" level), and may also perform an AND operation on the previously latched first waveform signal PH0 and the input clock signal CLKIN during a "high period" in which the input clock signal CLKIN has a second logic level (e.g., a "high" level), in order to generate the first output signal S1. As shown in FIG. 2, the clock gating circuit 110 may implemented in one example using a latch 112 and an AND gate 114.

Here, the latch 112 latches the first waveform signal PH0 in response to the input clock signal CLKIN to output a latch signal LS. The input clock signal CLKIN is input to a clock terminal of the latch 112 and the first waveform signal PH0 is input to an input terminal EN. For instance, the latch 112 may pass and output the first waveform signal PH0 as the latch signal LS during the low period of the input clock signal CLKIN, and may not pass the first waveform signal PH0 as the latch signal LS to maintain the previous latch signal LS during the high period of the input clock signal CLKIN. In other words, the latch 112 may pass a signal input to the input terminal EN to an output terminal Q in accordance with a particular logic level of the input clock signal CLKIN.

In this regard, those skilled in the art will understand that the designation of a particular logic level as "first" or "second"; "low" or "high" is arbitrary and may vary with design. Thus, the selected use of low/high or first/second with respect to signal levels might be readily reversed as dictated by different design objectives.

The AND gate 114 performs an AND operation on the latch signal LS output from the latch 112 and the input clock signal CLKIN. Consequently, the clock gating circuit 110 illustrated in FIG. 2 may gate the input clock signal CLKIN based on (or in response to) the latch signal LS obtained by latching the first waveform signal PH0 in response to the input clock signal CLKIN.

In the illustrated embodiment of FIG. 1, a buffer 140 is used to generate a buffered version of the input clock signal. The buffer 140 is discretely illustrated in FIG. 1 but may be included within the clock gating circuit 110 or the flop-flop 120. Those skilled in the art will recognize that the clock gating circuit 110 may be variously implemented using other, additional or differently arranged elements in other embodiments of the inventive concept. For example, a flip-flop may be used instead of the latch 112.

The flip-flop 120 receives the input clock signal CLKIN (or a buffered version of the input clock signal CLKIN) and a second waveform signal PH1 and generates a second output signal S2. The flip-flop 120 may be a D-Q flip-flop but is not restricted thereto. The second waveform signal PH1 may be identical to or different from the first waveform signal PH0.

The OR circuit 130 performs an OR operation on the first output signal S1 and the second output signal S2 to generate an output clock signal CLKOUT having a period which is N times the period of the input clock signal CLKIN, where 'N' is a positive real number. Among the rising and falling edges of the output clock signal CLKOUT, one edge (e.g., the rising edge) may not include skew while the other edge (e.g., the falling edge) includes skew. In other words, the clock generation circuit 100A may result in a single-edge deskew function by which skew of either the rising edge or the falling edge of the output clock signal CLKOUT is eliminated or significantly reduced. Accordingly, the clock generation circuit 100A eliminates skew of at least one of the rising and falling edges of a clock signal obtained by dividing the frequency of the input clock signal CLKIN by N in order to generate the output clock signal CLKOUT.

Figure 3:
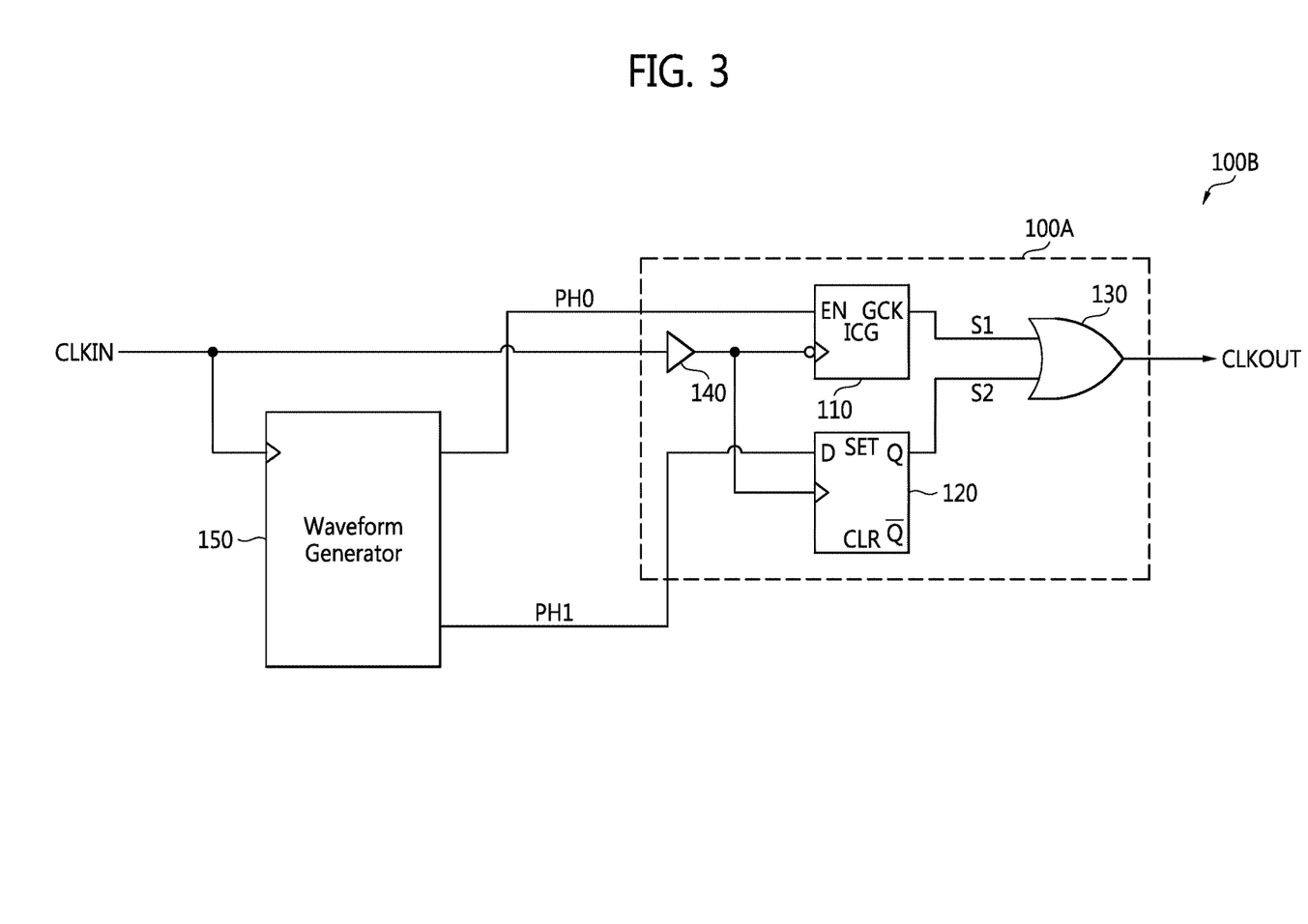
FIG. 3 is a circuit diagram of a clock generation circuit according to other embodiments of the inventive concept.

FIG. 3 is a circuit diagram illustrating a clock generation circuit 100B according to other embodiments of the inventive concept. Referring to FIGS. 1 and 3, the clock generation circuit 100B further includes a waveform generator 150 as compared to the clock generation circuit 100A illustrated in FIG. 1.

The waveform generator 150 may be used to generate the first and second waveform signals PH0 and PH1, as outputs, in response to the input clock signal CLKIN, applied as an input. The waveform generator 150 may divide the frequency of the input clock signal CLKIN by N to generate the first and second waveform signals PH0 and PH1 having periods that are N times longer than the period of the input clock signal CLKIN, for example.

Figure 4:
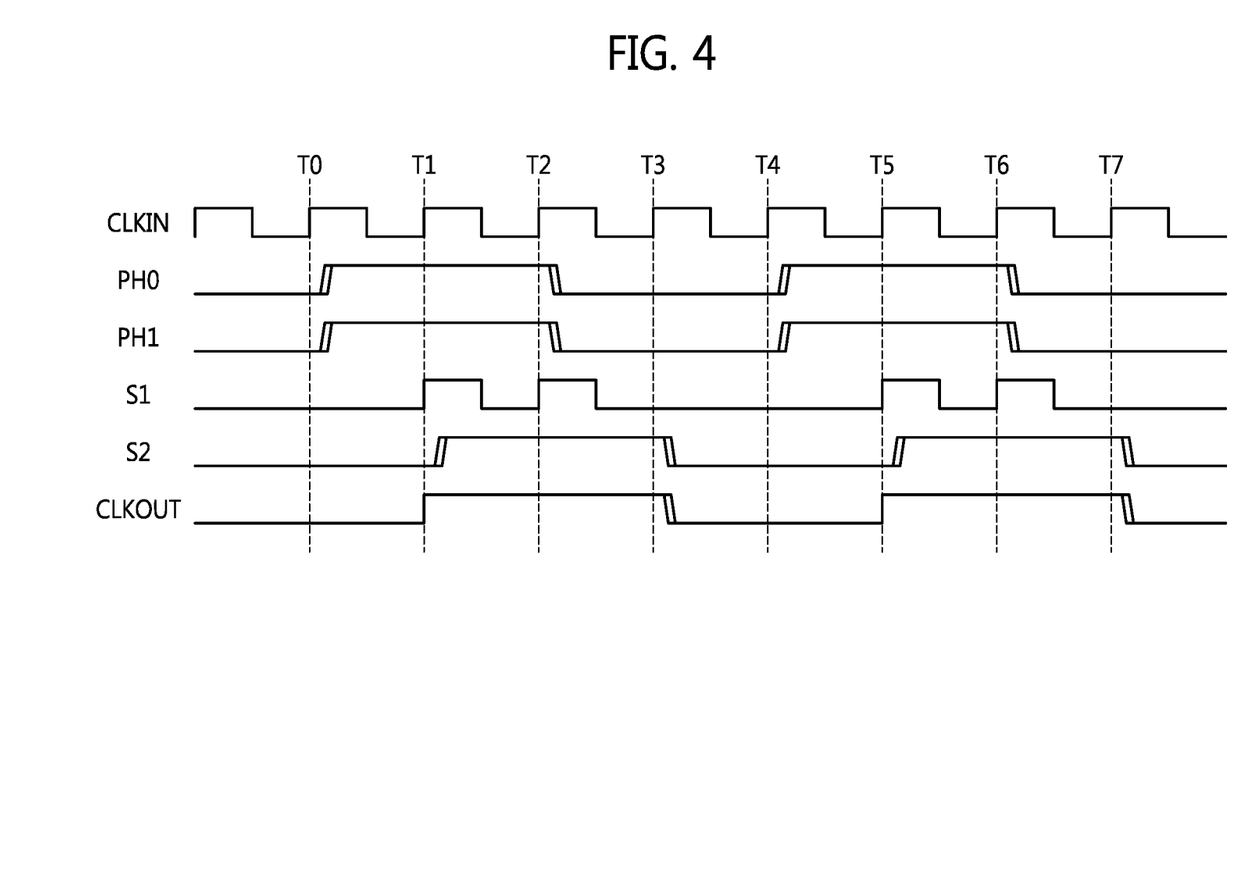
FIG. 4 is a waveform timing diagram of signals in the clock generation circuit illustrated in FIG. 3 according to some embodiments of the inventive concept.

FIG. 4 is a waveform timing diagram further illustrating various signal relationships that may exist in the clock generation circuit 100B of FIG. 3. An exemplary operation of the clock generation circuit 100B will be described with reference to FIGS. 3 and 4, where 'N' is assumed to be 4 and the first and second waveform signals PH0 and PH1 are assumed to have the same waveform. Accordingly, the first and second waveform signals PH0 and PH1 have a period which is about four times (4X) that of the period of the input clock signal CLKIN. Further, it is assumed that there is skew in the rising and falling edges of the first and second waveform signals PH0 and PH1.

The clock gating circuit 110 gates the input clock signal CLKIN based on the first waveform signal PH0 to generate the first output signal S1. The latch 112 of the clock gating circuit 110 passes and outputs the first waveform signal PH0 as the latch signal LS while the input clock signal CLKIN is low (i.e., at the first logic level), and does not pass the first waveform signal PH0 as the latch signal LS but instead maintains the previously latch signal LS while the input clock signal CLKIN is high (i.e., at the second logic level). Accordingly, the latch 112 may output a high input clock signal CLKIN as the latch signal LS while the input clock signal CLKIN is low, and may maintain the high input clock signal CLKIN which has been previously latched while the input clock signal CLKIN is high.

The AND gate 114 of the clock gating circuit 110 performs an AND operation on the latch signal LS and the input clock signal CLKIN to output the first output signal S1. Accordingly, while the input clock signal CLKIN is low, the AND gate 114 may perform an AND operation on the high latch signal LS and low input clock signal CLKIN to output a low first output signal S1. While the input clock signal CLKIN is high, the AND gate 114 may perform an AND operation on the high latch signal LS and the high input clock signal CLKIN to output the high first output signal S1.

Consequently, as shown in FIG. 4, the first output signal S1 has a similar waveform to that of the input clock signal CLKIN during two periods (e.g., time T1 to time T3) of the input clock signal CLKIN, and is thereafter maintained at low during the next two periods (e.g., time T3 to time T5) of the input clock signal CLKIN. However, unlike the first waveform signal PH0, the first output signal S1 has a skew-eliminated or skew-reduced waveform.

The flip-flop 120 receives the second waveform signal PH1 and generates the second output signal S2 in response to the input clock signal CLKIN. Accordingly, the flip-flop 120 may delay the second waveform signal PH1 by the period of the input clock signal CLKIN to output the second output signal S2. Consequently, as shown in FIG. 4, the second output signal S2 lags behind the second waveform signal PH1 by the period of the input clock signal CLKIN and has a similar waveform to the second waveform signal PH1.

The OR circuit 130 performs an OR operation on the first output signal S1 and the second output signal S2 to generate the output clock signal CLKOUT. Accordingly, the output clock signal CLKOUT may transition from low to high in response to a rising edge of the first output signal S1 and may transition from high to low in response to a falling edge of the second output signal S2. Consequently, the output clock signal CLKOUT has a similar waveform to the first and second waveform signals PH0 and PH1, but a period that is four times (4X) longer than the period of the input clock signal CLKIN. The output clock signal CLKOUT has a waveform in which skew of a rising edge is eliminated or reduced as compared to the first and second waveform signals PH0 and PH1.

When N is an even number, the clock generation circuit 100B generates the output clock signal CLKOUT having a period that is N times longer than the period of the input clock signal CLKIN, and which has the skew of a rising edge eliminated or reduced as compared to the input clock signal CLKIN. (See, e.g., the embodiment illustrated in FIG. 4). However, skew of a falling edge may be eliminated or reduced in the output clock signal CLKOUT in other embodiments of the inventive concept. For instance, when the clock generation circuit 100B is modified so that the clock gating circuit 110 responds to a high clock signal, the skew of a falling edge is eliminated or reduced in the output clock signal CLKOUT.

In the above-described embodiments, the output clock signal CLKOUT in which the skew of a rising edge is eliminated or reduced is obtained. Accordingly, the output clock signal CLKOUT exhibits improved jitter characteristics.

According to some embodiments of the inventive concept, a clock generation circuit which deskews either a rising edge or a falling edge requires a relatively small number of elements, and thus has lower complexity as compared to conventional clock generation circuits. In other embodiments of the inventive concept, a clock generation circuit may deskew both rising and falling edges.

Figure 5:
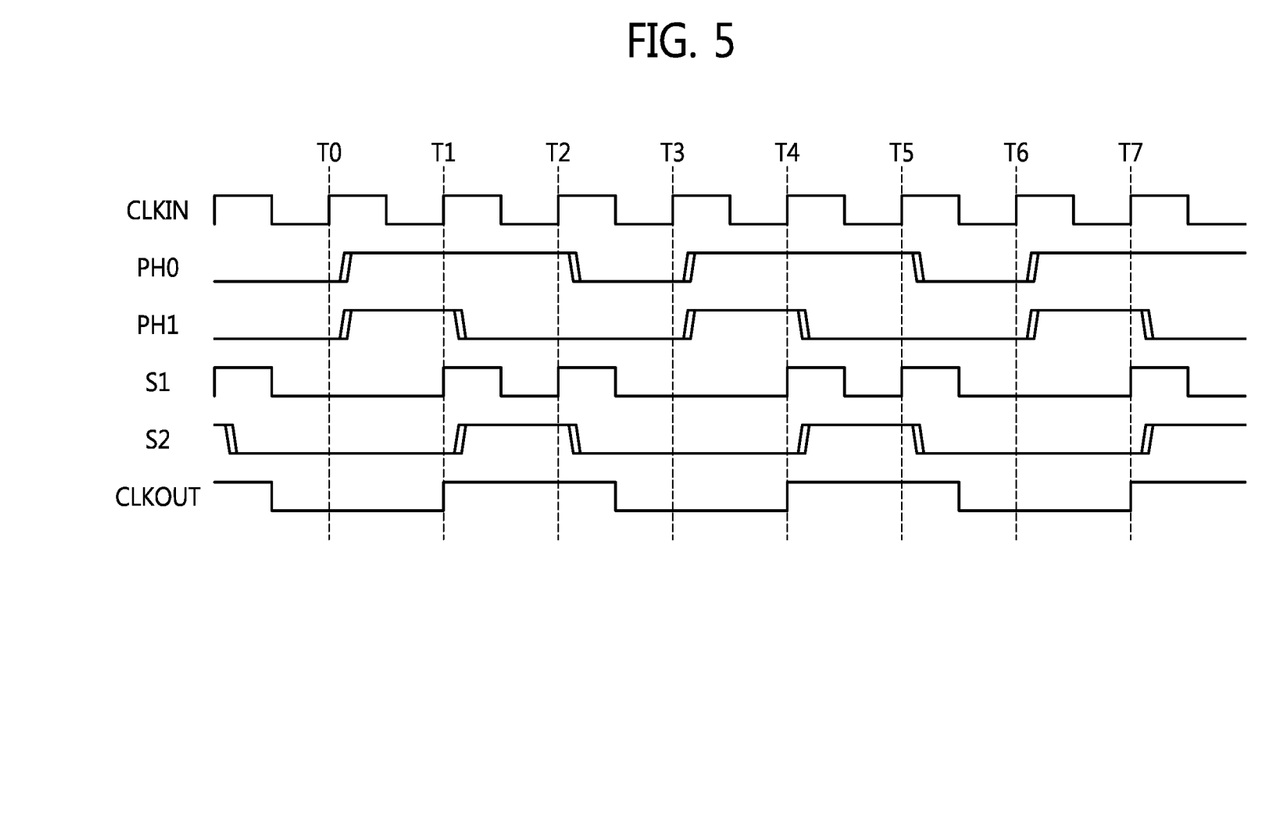
FIG. 5 is a waveform timing diagram of signals in the clock generation circuit illustrated in FIG. 3 according to other embodiments of the inventive concept.

FIG. 5 is another waveform timing diagram further illustrating various signal relationships that may exist in the clock generation circuit 100B of FIG. 3. The operation of the clock generation circuit 100B will be described with reference to FIGS. 3 and 5. In the embodiment illustrated in FIG. 5, it is assumed that N is 3 and the first and second waveform signals PH0 and PH1 have different waveforms.

The waveform generator 150 may be used to generate a first waveform signal PH0 that is high during two consecutive periods (e.g., time T0 to time T2) and then low during a single, following next period (e.g., time T2 to time T3), thereby generating a first waveform signal PH0 over a period that is three times (3X) the period of the input clock signal CLKIN. The waveform generator 150 may also be used to generate the second waveform signal that is high for a single period (e.g., time T0 to time T1) and low for the following two consecutive periods (e.g., time T1 to time T3), thereby generating a second waveform signal PH1 having a period that is three times (3X) the period of the input clock signal CLKIN. In the foregoing, each single "period" (e.g., time T1 to time t2, etc.) is defined by the period of the input clock CLKIN.

Accordingly in the illustrated example of FIG. 5, while each of the first and second waveform signals PH0 and PH1 has a period that is about three times (3X) the period of the input clock signal CLKIN, each one of the first and second waveform signals PH0 and PH1 has a different duty ratio. And as before, there is skew in the edges of the first and second waveform signals PH0 and PH1.

The clock gating circuit 110 gates the input clock signal CLKIN based on the first waveform signal PH0 to generate the first output signal S1. The latch 112 of the clock gating circuit 110 passes and outputs the first waveform signal PH0 as the latch signal LS while the input clock signal CLKIN is low, and does not pass the first waveform signal PH0 as the latch signal LS but maintains the previously latched signal LS while the input clock signal CLKIN is high. Accordingly, the latch 112 will output the high input clock signal CLKIN as the latch signal LS while the input clock signal CLKIN is low, but will maintain the high input clock signal CLKIN that has previously been latched while the input clock signal CLKIN is high.

The AND gate 114 of the clock gating circuit 110 performs an AND operation on the latch signal LS and the input clock signal CLKIN to output the first output signal S1. Accordingly, while the input clock signal CLKIN is low, the AND gate 114 may perform an AND operation on the high latch signal LS and the low input clock signal CLKIN to output the low first output signal S1. While the input clock signal CLKIN is high, the AND gate 114 may perform an AND operation on the high latch signal LS and high input clock signal CLKIN to output the high first output signal S1.

Consequently, as shown in FIG. 5, the first output signal S1 has a similar waveform to the input clock signal CLKIN during two periods (e.g., time T1 to time T3) of the input clock signal CLKIN and is maintained low during the next period (e.g., time T3 to time T4). However, unlike the first waveform signal PH0, the first output signal S has a skew-eliminated or skew-reduced waveform.

The flip-flop 120 receives the second waveform signal PH1 and generates the second output signal S2 in response to the input clock signal CLKIN. Accordingly, the flip-flop 120 may delay the second waveform signal PH1 by the period of the input clock signal CLKIN to output the second output signal S2. Consequently, as shown in FIG. 5, the second output signal S2 lags behind the second waveform signal PH1 by the period of the input clock signal CLKIN and has a similar waveform to the second waveform signal PH1.

The OR circuit 130 performs an OR operation on the first output signal S1 and the second output signal S2 to generate the output clock signal CLKOUT. Accordingly, the output clock signal CLKOUT may transition from low to high in response to a rising edge of the first output signal S1, and may transition from high to low in response to a falling edge of the first output signal S1. Consequently, the output clock signal CLKOUT has a period that is three times (3X) longer than the period of the input clock signal CLKIN. The output clock signal CLKOUT has a waveform in which skew of both a rising edge and a falling edge is eliminated or reduced.

When N is an odd number, the clock generation circuit 100B generates the output clock signal CLKOUT having a period that is N times longer than the period of the input clock signal CLKIN and which has the skew of both rising and falling edges eliminated or reduced as compared to the input clock signal CLKIN (See, e.g., the embodiment illustrated in FIG. 5).

Figure 6:
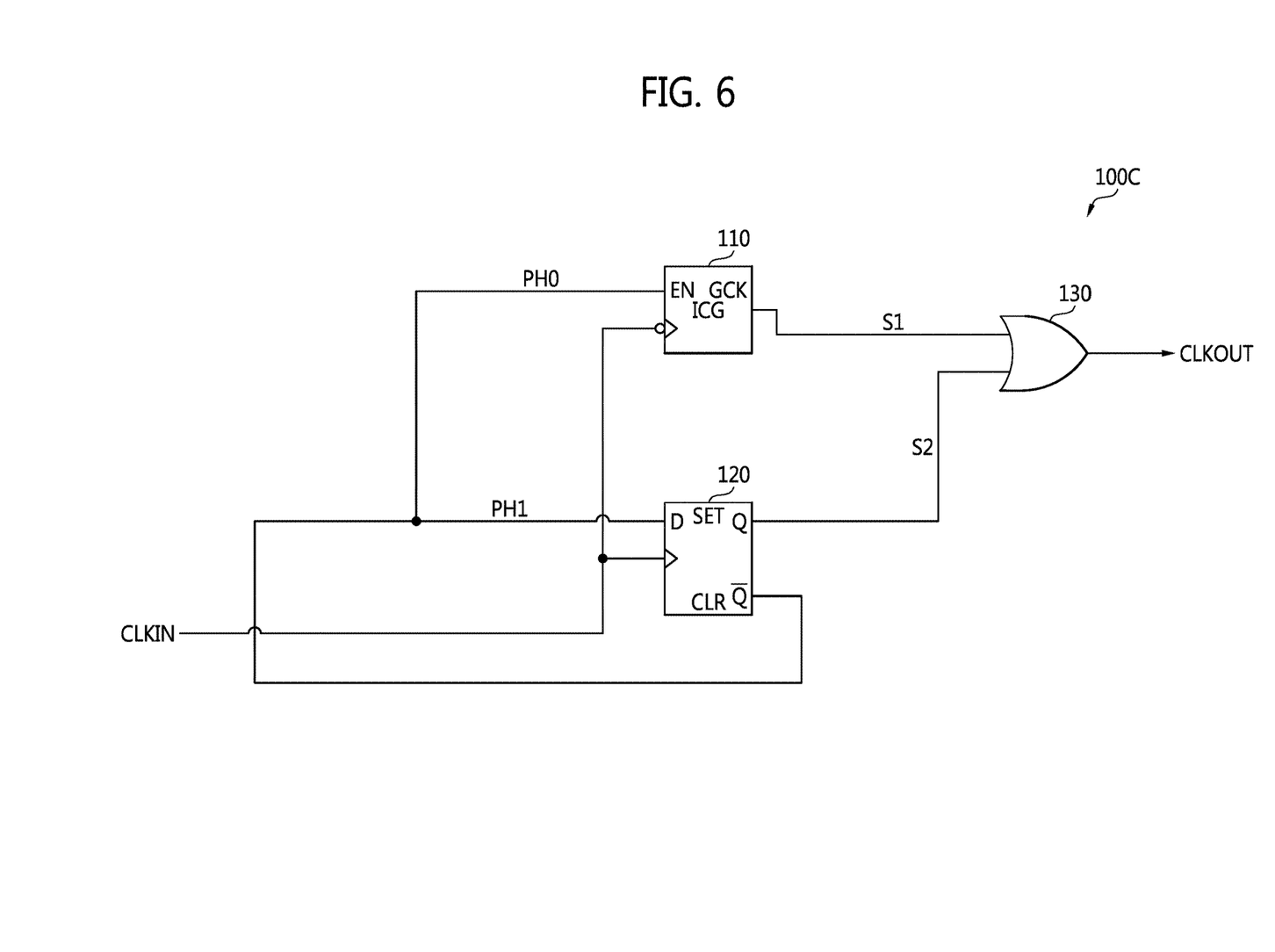
FIG. 6 is a circuit diagram of a clock generation circuit according to still other embodiments of the inventive concept.

FIG. 6 is a circuit diagram illustrating a clock generation circuit 100C according to still other embodiments of the inventive concept. Since the clock generation circuit 100C is similar to the clock generation circuit 100A illustrated in FIG. 1, description will be focused on differences between the clock generation circuits 100A and 100C to avoid redundancy.

Referring to FIG. 6, a positive output signal Q of the flip-flop 120 is provided as the second output signal S2 and a negative output signal /Q of the flip-flop 120 is provided as the first and second waveform signals PH0 and PH1. In other words, the negative output signal /Q of the flip-flop 120 is used as the first and second waveform signals PH0 and PH1 in the embodiments illustrated in FIG. 6, thereby eliminating the requirement for a separate waveform generator like the one illustrated in FIG. 3.

The clock generation circuit 100C illustrated in FIG. 6 divides the frequency of the input clock signal CLKIN by two (2) and eliminates skew to generate the output clock signal CLKOUT. The clock generation circuit 100C uses a minimum count of constituent flip-flops. Since the clock generation circuit 100C uses the negative output signal /Q of the flip-flop 120 as the first and second waveform signals PH0 and PH1, the clock generation circuit 100C does not need the waveform generator 150 included in the clock generation circuit 100B illustrated in FIG. 3.

Figure 7:
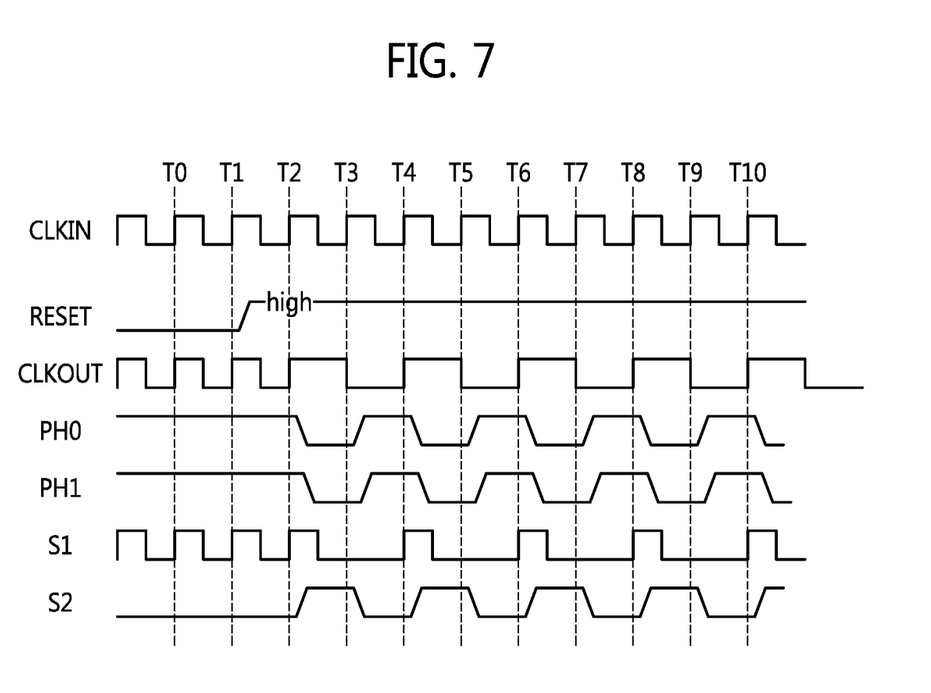
FIG. 7 is a waveform timing diagram of signals in the clock generation circuit illustrated in FIG. 6 according to some embodiments of the inventive concept.

FIG. 7 is still another waveform timing diagram further illustrating various signal relationships that may exist in the clock generation circuit 100C of FIG. 6. Hence, operation of the clock generation circuit 100C will be described in some additional detail with reference to FIGS. 6 and 7.

During a reset period, wherein a reset signal RESET is low (i.e., up to the transition of the reset signal RESET from low to high at time T2), the clock generation circuit 100C passes and outputs the input clock signal CLKIN as the output clock signal CLKOUT. Accordingly, the output clock signal CLKOUT is the same as the input clock signal CLKIN during the reset period.

For instance, the flip-flop 120 outputs a low positive output signal Q and a high negative output signal /Q during the reset period. Accordingly, the first and second waveform signals PH0 and PH1 are high. As a result, the clock gating circuit 110 outputs the first output signal S1 having the same waveform as the input clock signal CLKIN during the reset period. The second output signal S2 which is the positive output signal Q of the flip-flop 120 is low. Consequently, the output clock signal CLKOUT has substantially the same waveform as the input clock signal CLKIN during the reset period.

When the reset signal RESET transitions from low to high (or releases), the flip-flop 120 outputs a D input signal (the same as the negative output signal /Q) as the positive output signal Q in response to the input clock signal CLKIN. Accordingly, the positive output signal Q (i.e., the second output signal S2) has a level that changes with each period of the input clock signal CLKIN, and thus has a period that is two times (2X) the period of the input clock signal CLKIN, as shown in FIG. 7.

The first and second waveform signals PH0 and PH1 are the negative output signal /Q and thus have a phase difference (about 180 degrees) from the positive output signal Q. Accordingly, as shown in FIG. 7, the first and second waveform signals PH0 and PH1 also have a period that is around two times (2X) longer than the period of the input clock signal CLKIN, but may also have skew.

The clock gating circuit 110 gates the first waveform signal PH0 in response to the input clock signal CLKIN to generate the first output signal S1. The structure and operation of the clock gating circuit 110 may be the same as those described with reference to FIGS. 1 and 2 above.

The first output signal S1 has a similar waveform to the input clock signal CLKIN during one period of the input clock signal CLKIN (e.g., time T2 to time T3, or time T4 to time T5) and is maintained low during the next one period of the input clock signal CLKIN (e.g., time T3 to time T4, or time T5 to time T6), as shown in FIG. 7. However, unlike the first waveform signal PH0, the first output signal S1 has a skew-eliminated or skew-reduced waveform.

The OR circuit 130 performs an OR operation on the first output signal S1 and the second output signal S2 to generate the output clock signal CLKOUT. Accordingly, the output clock signal CLKOUT may transition from low to high in response to a rising edge of the first output signal S1, and may transition from high to low in response to a falling edge of the second output signal S2. Consequently, the output clock signal CLKOUT has a period that is two times (2X) longer than the period of the input clock signal CLKIN, and skew of a rising edge may be eliminated or reduced, but skew of a falling edge may not be eliminated or reduced in the output clock signal CLKOUT.

Figure 8:
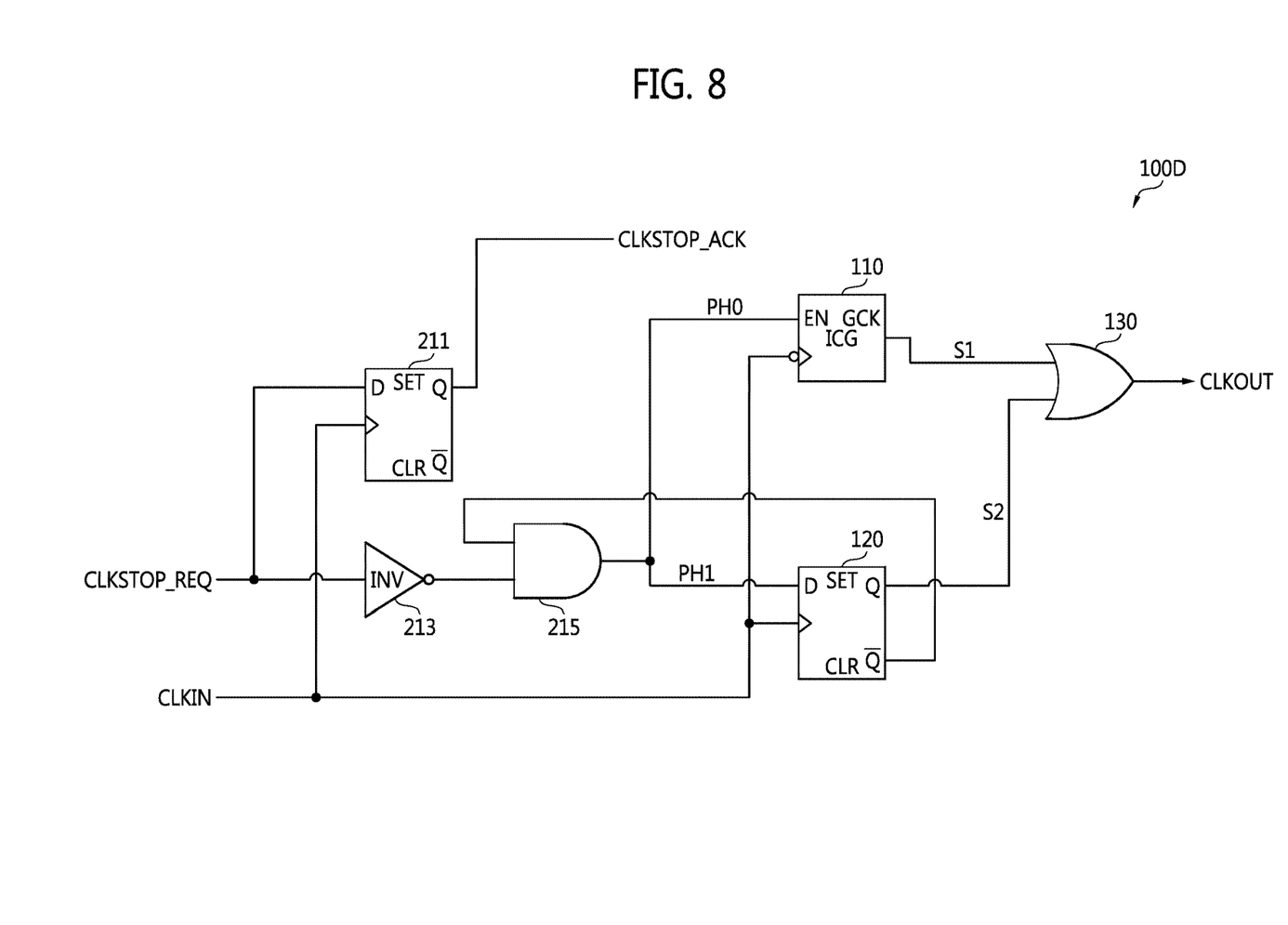
FIG. 8 is a circuit diagram of a modification of the clock generation circuit illustrated in FIG. 6.
Figure 9:
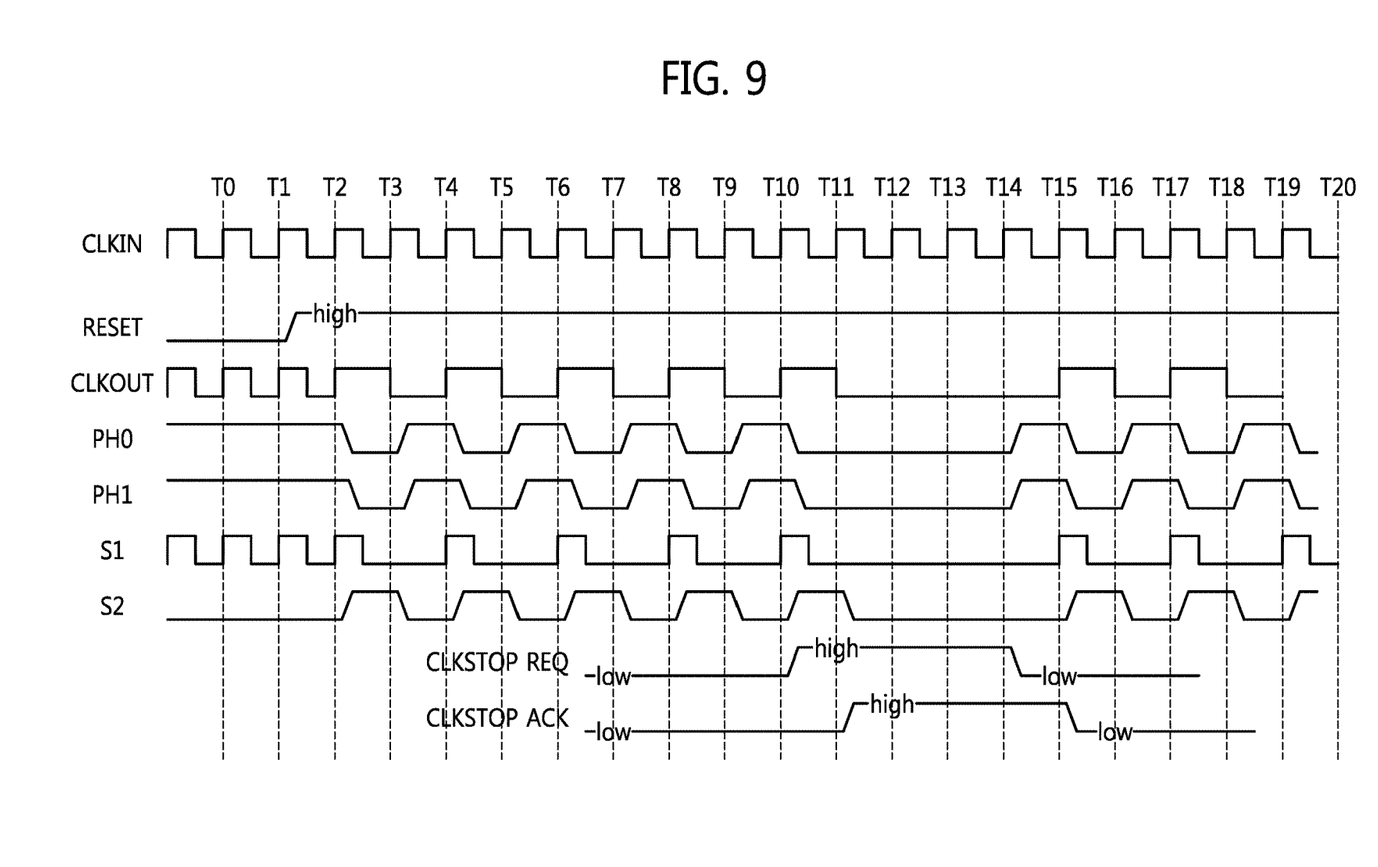
FIG. 9 is a waveform timing diagram of signals in the clock generation circuit illustrated in FIG. 8 according to some embodiments of the inventive concept.

FIG. 8 is a circuit diagram illustrating a clock generation circuit 100D that is a modification of the clock generation circuit 100C illustrated in FIG. 6. FIG. 9 is a waveform timing diagram further illustrating various signal relationships that may exist in the clock generation circuit 100B of FIG. 8. The operation of the clock generation circuit 100D will be described with reference to FIGS. 8 and 9.

The clock generation circuit 100D of FIG. 8 has an additional clock stop feature as compared to the clock generation circuit 100C of FIG. 6. Since the clock generation circuit 100D illustrated in FIG. 8 is similar to the clock generation circuit 100C illustrated in FIG. 6, description will be focused on differences between the clock generation circuits 100C and 100D to avoid redundancy. As compared to the clock generation circuit 100C illustrated in FIG. 6, the clock generation circuit 100D illustrated in FIG. 8 further includes a flip-flop 211, an inverter 213, and an AND element 215.

The flip-flop 211 receives a clock stop request signal CLKSTOP_REQ and outputs a clock stop response signal CLKSTOP_ACK. With this configuration, the flip-flop 211 delays the clock stop request signal CLKSTOP_REQ by one clock cycle to output the clock stop response signal CLKSTOP_ACK. The clock stop request signal CLKSTOP_REQ may be received from a processor or a host (not shown) outside the clock generation circuit 100D. The clock stop response signal CLKSTOP_ACK is a response to the clock stop request signal CLKSTOP_REQ and may be communicated (or returned) to the processor or the host.

The inverter 213 inverts the clock stop request signal CLKSTOP_REQ. The AND element 215 performs an AND operation on an output signal of the inverter 213 and the negative output signal /Q of the flip-flop 120 to output the first and second waveform signals PH0 and PH1. In other words, the AND element 215 is a logic operation element which selectively generates the first and second waveform signals PH0 and PH1 based on the clock stop request signal CLKSTOP_REQ.

Accordingly, when the clock stop request signal CLKSTOP_REQ transition to high, the first and second waveform signals PH0 and PH1 transition to low, and therefore, the output clock signal CLKOUT is not generated, as shown in FIG. 9. When the clock stop request signal CLKSTOP_REQ transitions to high, the output signal of the inverter 213 transitions to low level regardless of the negative output signal /Q of the flip-flop 120. Thus, both of the first and second waveform signals PH0 and PH1 transition to low. Accordingly, the first and second output signals S1 and S2 also transition to low. As a result, the output clock signal CLKOUT is not generated.

However, when the clock stop request signal CLKSTOP_REQ transitions from high to low, the output signal of the inverter 213 allows the negative output signal /Q of the flip-flop 120 to be output to the first and second output signals S1 and S2. In other words, the negative output signal /Q of the flip-flop 120 is provided as the first and second waveform signals PH0 and PH1. As a result, the output clock signal CLKOUT is generated.

Figure 10:
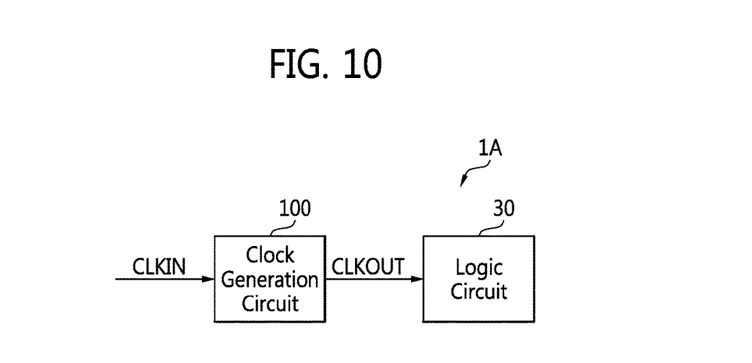
FIG. 10 is a block diagram of a semiconductor integrated circuit (IC) device including a clock generation circuit according to some embodiments of the inventive concept.

FIG. 10 is a block diagram of a semiconductor integrated circuit (IC) device 1A including a clock generation circuit 100 according to one or more embodiments of the inventive concept. Referring to FIGS. 1 through 10, the semiconductor IC device 1A includes the clock generation circuit 100 and a logic circuit 30. The clock generation circuit 100 may be the clock generation circuit 100A, 100B, 100C, and/or 100D illustrated in FIG. 1, 3, 6, or 8. The clock generation circuit 100 may receive the input clock signal CLKIN and may output the output clock signal CLKOUT. The logic circuit 30 may receive the output clock signal CLKOUT from the clock generation circuit 100 and may operate based on the output clock signal CLKOUT.

Figure 11:
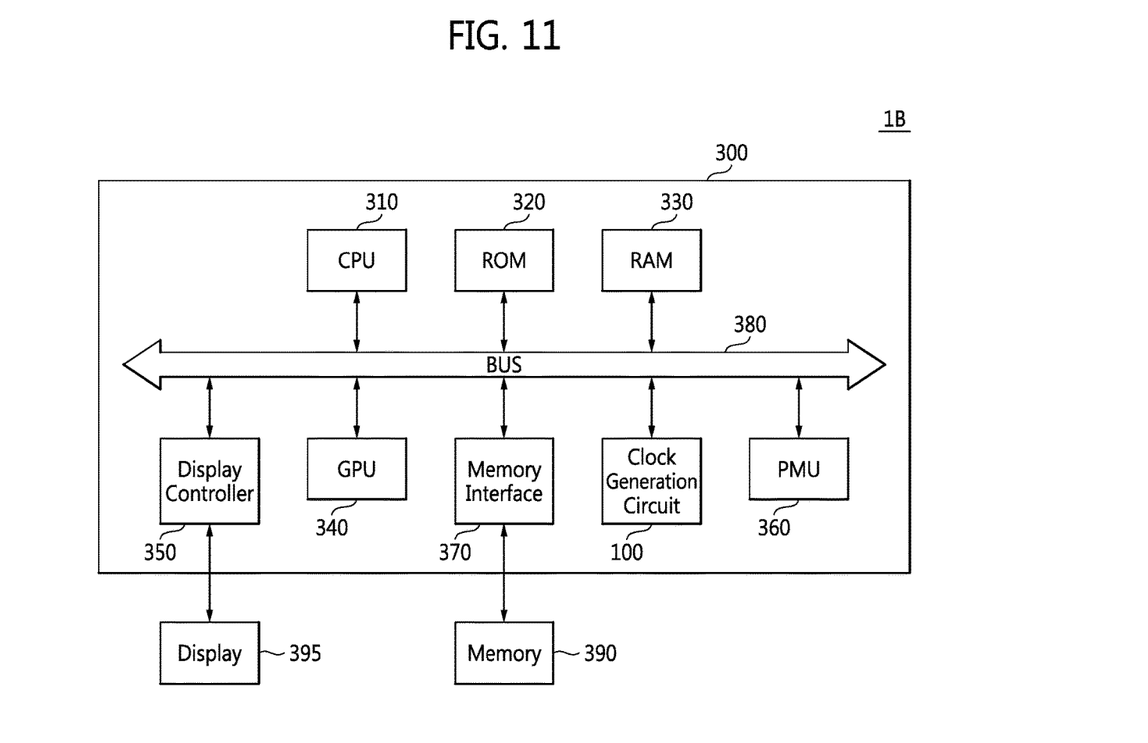
FIG. 11 is a block diagram of a semiconductor IC device including a clock generation circuit according to other embodiments of the inventive concept.

FIG. 11 is a block diagram of a semiconductor IC device 1B including the clock generation circuit 100 according to one or more embodiments of the inventive concept. Referring to FIG. 11, the semiconductor IC device 1B may be implemented as a handheld device such as a mobile telephone, a smart phone, a tablet computer, a personal digital assistant (PDA), an enterprise digital assistant (EDA), a digital still camera, a digital video camera, a portable multimedia player (PMP), a personal navigation device or portable navigation device (PND), a handheld game console, or an e-book. The semiconductor IC device 1B may include a system on chip (SoC) 300, a memory device 390, and a display device 395.

The SoC 300 may include a central processing unit (CPU) 310, a read-only memory (ROM) 320, a random access memory (RAM) 330, a graphics processing unit (GPU) 340, the clock generation circuit 100, a display controller 350, a memory interface 370, and a bus 380. The SoC 300 may also include a power management unit (PMU) 360. The SoC 300 may also include other elements. The PMU 360 is implemented inside the SoC 360 in the embodiments illustrated in FIG. 11, but the PMU 360 may be implemented outside the SoC 300 in other embodiments.

The CPU 310, which may be referred to as a processor, may process or execute programs and/or data stored in the memory device 390. For instance, the CPU 310 may process or execute the programs and/or the data in response to a clock signal output from a clock signal generator (not shown). The CPU 310 may be implemented as a multi-core processor. The multi-core processor is a single computing component with two or more independent actual processors (referred to as cores). Each of the processors reads and executes program instructions. The multi-core processor can drive a plurality of accelerators at a time, and therefore, a data processing system including the multi-core processor can perform multi-acceleration.

Programs and/or data stored in the ROM 320, the RAM 330, and the memory device 390 may be loaded to memory in the CPU 310 when necessary. The ROM 320 may store permanent programs and/or data. The ROM 320 may be implemented as erasable programmable ROM (EPROM) or electrically erasable programmable ROM (EEPROM).

The RAM 330 may temporarily store programs, data, or instructions. The programs and/or data stored in the memory device 390 may be temporarily stored in the RAM 330 according to the control of the CPU 310 or a booting code stored in the ROM 320. The RAM 330 may be implemented as dynamic RAM (DRAM) or static RAM (SRAM).

The GPU 340 may process data read by the memory interface 370 from the memory device 390 into a signal suitable to display.

The clock generation circuit 100 may be the clock generation circuit 100A, 100B, 100C, or 100D illustrated in FIG. 1, 3, 6, or 8. The clock generation circuit 100 may provide a clock signal for other modules, i.e., the CPU 310, the ROM 320, the RAM 330, the GPU 340, the display controller 350, and the memory interface 370 in the SoC 300.

The memory interface 370 is a block for interfacing with the memory device 390. The memory interface 370 controls the overall operation of the memory device 390 and controls data exchange between a host and the memory device 390. For instance, the memory interface 370 writes data to the memory device 390 or reads data from the memory device 390 at the request of the host. Here, the host may be a processing unit such as the CPU 310, the GPU 340, or the display controller 350.

The memory device 390 is a storage for storing data and it may store an operating system (OS) and various kinds of programs and data. The memory device 390 may be DRAM but is not restricted thereto. For instance, the memory device 390 may be non-volatile memory such as flash memory, phase-change RAM (PRAM), magneto-resistive RAM (MRAM), resistive RAM (ReRAM) or ferroelectric RAM (FeRAM). In other embodiments, the memory device 390 may be an embedded memory provided within the SoC 300. The elements 310, 320, 330, 340, 350, 360, and 100 may communicate with one another through the bus 380.

The display device 395 may display image signals output from the display controller 350. The display device 395 may be implemented as a liquid crystal display (LCD) device, a light emitting diode (LED) display device, an organic LED (OLED) display device, or an active-matrix OLED (AMOLED) display device. The display controller 350 controls the operation of the display device 395.

Figure 12:
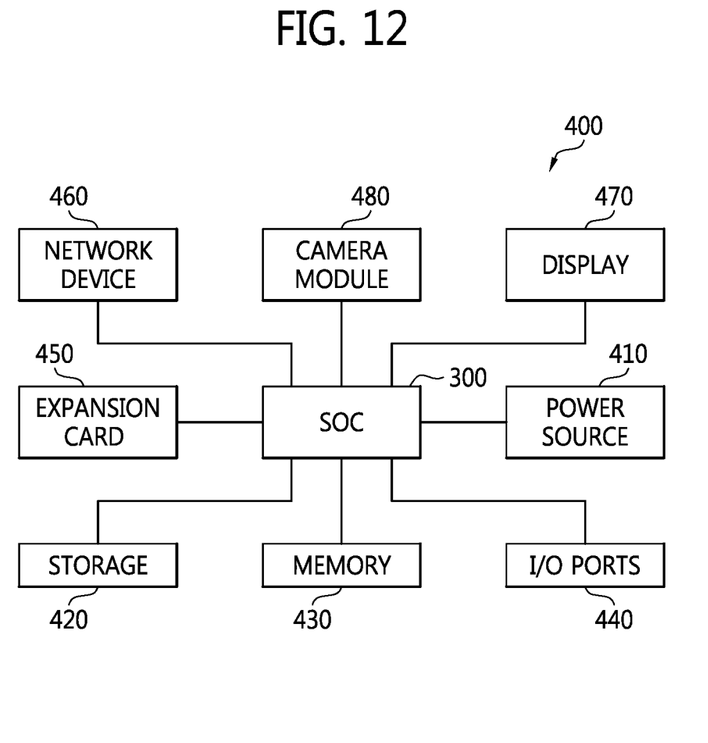
FIG. 12 is a block diagram of an electronic system 400 including the SoC according to some embodiments of the inventive concept.

FIG. 12 is a block diagram of an electronic system 400 including the SoC according to some embodiments of the inventive concept. Referring to FIG. 12, the electronic system 400 may be implemented as a PC, a data server, a laptop computer or a portable device. The portable device may be a cellular phone, a smart phone, a tablet personal computer (PC), a personal digital assistant (PDA), an enterprise digital assistant (EDA), a digital still camera, a digital video camera, a portable multimedia player (PMP), portable navigation device (PDN), a handheld game console, or an e (electronic)-book device.

The electronic system 400 includes the SoC 300, a power source 410, a storage device 420, a memory 430, I/O ports 440, an expansion card 450, a network device 460, and a display 470. The electronic system 400 may further include a camera module 480.

The SoC 300 corresponds to the SoC 300 illustrated in FIG. 11. The SoC 300 may control the operation of at least one of the elements 410 through 480. The power source 410 may supply an operating voltage to at least one of the elements 300, and 420 through 480. The storage device 420 may be implemented by a hard disk drive (HDD) or a solid state drive (SSD).

The memory 430 may be implemented by a volatile or non-volatile memory. The memory 430 may correspond to the memory 390 illustrated in FIG. 11. A memory interface 370 (shown in FIG. 11) that controls a data access operation, e.g., a read operation, a write operation (or a program operation), or an erase operation, on the memory 430 may be integrated into or embedded in the SoC 300. Alternatively, the memory interface may be provided between the SoC 300 and the memory 430.

The I/O ports 440 are ports that receive data transmitted to the electronic system 400 or transmit data from the electronic system 400 to an external device. For instance, the I/O ports 440 may include a port connecting with a pointing device such as a computer mouse, a port connecting with a printer, and a port connecting with a USB drive.

The expansion card 450 may be implemented as a secure digital (SD) card or a multimedia card (MMC). The expansion card 450 may be a subscriber identity module (SIM) card or a universal SIM (USIM) card.

The network device 460 enables the electronic system 400 to be connected with a wired or wireless network. The display 470 displays data output from the storage device 420, the memory 430, the I/O ports 440, the expansion card 450, or the network device 460.

The camera module 480 converts optical images into electrical images. Accordingly, the electrical images output from the camera module 480 may be stored in the storage module 320, the memory 430, or the expansion card 450. Also, the electrical images output from the camera module 480 may be displayed through the display 470.

As described above, according to some embodiments of the inventive concept, a clock generation circuit reduces the skew of at least one of the rising and falling edges of a clock signal, thereby improving the jitter characteristics of the clock signal. In addition, the clock generation circuit requires a relatively small number of constituent elements and low complexity.

While the inventive concept has been particularly shown and described with reference to exemplary embodiments thereof, it will be understood by those of ordinary skill in the art that various changes in forms and details may be made therein without departing from the scope of the inventive concept as defined by the following claims.

What is claimed is:

1. A clock generation circuit comprising:
a clock gating circuit configured to receive a first waveform signal in response to an input clock signal and generate a first output signal;
a flip-flop configured to receive the input clock signal and a second waveform signal and generate a second output signal; and
an OR circuit configured to perform an OR operation on the first output signal and the second output signal to generate an output clock signal having a period which is N times that of a period of the input clock signal, where 'N' is a positive real number;
wherein the first and second waveform signals are an inverted signal of the second output signal.

2. The clock generation circuit of claim 1, wherein the clock gating circuit comprises:
a latch configured to latch the first waveform signal in response to the input clock signal; and an AND element configured to perform an AND operation on an output signal of the latch and the input clock signal.

3. The clock generation circuit of claim 1, wherein the flip-flop comprises:
   a clock terminal configured to receive the input clock signal;
   an input terminal configured to receive the second waveform signal;
   a positive output terminal configured to output the second output signal; and
   a negative output terminal configured to output an inverted signal of the second output signal, and
   the output signal of the negative output signal is provided as the first and second waveform signals.

4. The clock generation circuit of claim 1, wherein the clock generation circuit passes and outputs the input clock signal as the output clock signal in response to a reset signal during a reset period.

5. The clock generation circuit of claim 1, further comprising:
   a second flip-flop configured to delay a clock stop request signal to generate a clock stop response signal; and
   a logic operation element configured to generate the first and second waveform signals based on the clock stop request signal,
   wherein the flip-flop is a first flip-flop.

6. A semiconductor integrated circuit device comprising:
   a clock generation circuit configured to receive an input clock signal and generate an output clock signal having a period N times that of a period of the input clock signal and having skew of at least one of rising edges and falling edges reduced, where N is a positive real number; and
   a logic circuit configured to receive the output clock signal,
   wherein the clock generation circuit comprises
   a clock gating circuit configured to receive a first waveform signal in response to the input clock signal and generate a first output signal,
   a first flip-flop configured to delay a second waveform signal in response to the input clock signal to generate a second output signal, and
   an OR circuit configured to perform an OR operation on the first output signal and the second output signal to generate the output clock signal,
   wherein the first flip-flop comprises
   a positive output terminal configured to output the second output signal, and
   a negative output terminal configured to output an inverted signal of the second output signal, and
   the first and second waveform signals are based on an output signal of the negative output terminal of the first flip-flop.

7. The semiconductor integrated circuit device of claim 6, wherein the clock generation circuit further comprises:
   a second flip-flop configured to delay a clock stop request signal to generate a clock stop response signal; and
   a logic operation element configured to perform an AND operation on an inverted signal of the clock stop request signal and the output signal of the negative output terminal of the first flip-flop to generate the first and second waveform signals.

8. The semiconductor integrated circuit device of claim 6, wherein the clock gating circuit comprises:
   a latch configured to output the first waveform signal as a latch signal in response to a low value of the input clock signal, and to maintain a previous value of the latch signal as an output in response to a high value of the input clock signal, and
   an AND element configured to perform an AND operation on the latch signal and the input clock signal.

9. A clock generation circuit comprising:
   a waveform generator configured to generate a first waveform signal and a second waveform signal which have a period N times a period of an input clock signal, where N is a real number;
   a clock gating circuit configured to gate the input clock signal based on the first waveform signal to generate a first output signal;
   a flip-flop configured to receive the input clock signal and the second waveform signal and to generate a second output signal; and
   an OR circuit configured to perform an OR operation on the first output signal and the second output signal to generate an output clock signal,
   wherein the waveform generator provides an inverted signal of the second output signal as the first and second waveform signals.

10. The clock generation circuit of claim 9, wherein the clock generation circuit passes and outputs the input clock signal as the output clock signal in response to a reset signal during a reset period.

* * * * *